United States Patent
Koeferl

(10) Patent No.: US 11,442,553 B2
(45) Date of Patent: Sep. 13, 2022

(54) APPARATUS AND METHOD FOR DETECTING ACTUATION OF A SWITCH

(71) Applicant: Cherry GmbH, Auerbach/Opf (DE)

(72) Inventor: Erwin Koeferl, Neuhaus (DE)

(73) Assignee: CHERRY GMBH, Auerbach/Opf (DE)

( * ) Notice: Subject to any disclaimer, the term of this patent is extended or adjusted under 35 U.S.C. 154(b) by 0 days.

(21) Appl. No.: 16/015,111

(22) Filed: Jun. 21, 2018

(65) Prior Publication Data

US 2019/0391669 A1 Dec. 26, 2019

Related U.S. Application Data

(63) Continuation of application No. PCT/EP2016/077559, filed on Nov. 14, 2016.

(30) Foreign Application Priority Data

Dec. 21, 2015 (DE) .................. 10 2015 226 315.0

(51) Int. Cl.
*G06F 3/02* (2006.01)
*H03K 5/1254* (2006.01)

(52) U.S. Cl.
CPC ......... *G06F 3/0227* (2013.01); *H03K 5/1254* (2013.01)

(58) Field of Classification Search
CPC .................... G06F 3/0227; H03K 5/1254
See application file for complete search history.

(56) References Cited

U.S. PATENT DOCUMENTS

| | | | | |
|---|---|---|---|---|
| 5,714,983 A | * | 2/1998 | Sacks .................. | G06F 3/023 341/22 |
| 6,650,317 B1 | * | 11/2003 | Boone .................. | G06F 3/1407 341/26 |
| 2005/0057514 A1 | * | 3/2005 | Bathiche ............. | G06F 3/02 345/168 |
| 2005/0240834 A1 | * | 10/2005 | Rowlan ............... | G06F 11/27 714/47.1 |
| 2006/0195907 A1 | * | 8/2006 | Delfs .................... | G06F 21/74 726/26 |
| 2008/0120437 A1 | * | 5/2008 | Butterfield .......... | G06F 3/0233 710/5 |
| 2009/0303013 A1 | * | 12/2009 | Edgerton ............ | G06K 7/0008 340/10.1 |
| 2011/0291799 A1 | * | 12/2011 | Girard, III .......... | G07C 9/00309 340/5.72 |
| 2016/0130788 A1 | * | 5/2016 | Nee ...................... | B60T 13/662 701/50 |
| 2017/0099065 A1 | * | 4/2017 | Lee ...................... | H03K 17/967 |

* cited by examiner

*Primary Examiner* — Henry Tsai
*Assistant Examiner* — Aurangzeb Hassan
(74) *Attorney, Agent, or Firm* — James R. Hayne; Stites & Harbison PLLC

(57) ABSTRACT

The invention relates to a method and an apparatus with circuitry comprising at least one mechanical switch serving to open and/or close an electric contact and a processor unit serving to perform first query and a second query of a contact state of the contact, with the processor unit further serving to provide an output signal on the basis of information on a change of the contact state of the contact detected by means of the first and second queries, wherein the processor unit is configured to perform the second query after the first query with a timing so that the second query precedes an expected bounce of the contact.

5 Claims, 2 Drawing Sheets

APPARATUS AND METHOD FOR DETECTING ACTUATION OF A SWITCH

RELATED APPLICATIONS

This application claims priority benefit of and is a Continuation Application of co-pending International Patent Application PCT/EP2016/077559, which was filed on Nov. 14, 2016. International Patent Application n PCT/EP2016/077559 claimed priority benefit of German Patent Application No. 10 2015 226 315.0, which was filed Dec. 21, 2015. The entire contents of the above identified prior filed applications are hereby incorporated herein by reference.

FIELD OF THE INVENTION

The invention relates to an apparatus with circuitry comprising at least one mechanical switch serving to open and/or close an electric contact and a processor unit serving to perform first query and a second query of a contact state of the contact, with the processor unit further serving to provide an output signal on the basis of information on a change of the contact state of the contact detected by means of the first and second queries.

BACKGROUND

Such apparatuses can be found often in everyday life, for example as keyboard or as operating apparatuses in automobiles. In certain applications it is advantageous if the actuation of the switch is detected and reported as quickly as possible. When using a keyboard, for example for a real-time strategy game, it may happen that a command is to be triggered as quickly as possible the actuation of one of the keys. Conventionally, however, the response time of a switch or push button is delayed by the so-called the bounds time of every mechanical push button. For example, this means that after a switch is closed the contact first bounces from the closed state back into the open state. Within the first five to hundred milliseconds, depending on size and mechanical setup of the switch, the switch bounces back and forth between the open and closed states. The time until this bouncing stops is referred to as debounce time in the context of this invention.

In conventional switches, a change of the contact state of the switch first is detected, it is waited for the debounce time, and then the contact state of the switch is checked again before this change is reported. This leads to a delay between actuation of the switch and reporting the switch, which is regarded as disadvantages in certain applications.

Published Japanese patent application JP2002190725 discloses a method for recognition of opening or closing an electric contact. In this method, a change of the contact state of a switch is reported or stored immediately after the change is detected. Thus, the debounce time as well as the ensuing processing of the switch signal is bypassed by omitting debouncing. In particular, this is contagious if a slow or inexpensive processor is used to process the switch signal.

Published U.S. patent application US2011291799 discloses a switch and a method, wherein a change of the contact state is detected by way of a first query of the contact. It is waited for the debounce time, and a second query of the contact takes place to ensure that a change has actually happened. Thus, it can be ensured that the first detection of a change of the contact state is not the result of any electrical interference, for example. For example, electrostatic discharge may lead to the detection of a change. By way of checking after the debounce time, it can be ensured that the switch has actually been closed or opened.

SUMMARY

Hence, it is the object of the invention to propose an apparatus and a method of improved detection of a change of the contact state of a contact of a mechanical switch.

The object is achieved by an apparatus according to the present invention and by a method according to the present invention.

Thus, the object is achieved by an apparatus with circuitry comprising at least one mechanical switch serving to open and/or close an electric contact and a processor unit serving to perform first query and a second query of a contact state of the contact, with the processor unit further serving to provide an output signal on the basis of information on a change of the contact state of the contact detected by means of the first and second queries, wherein the processor unit is configured to perform the second query after the first query with a timing so that the second query precedes an expected bounce of the contact. Thus, erroneous detection, i.e. a change of the contact state due to electrostatic discharge, for example, may be excluded.

The contact state is queried twice. For example, a query may be made by the processor unit sampling the voltage of a sensing circuit of the contact. The first query may take place in a normal query cycle of the processor unit, for example. Herein, the processor unit performs a regular query of the contact state. If the processor unit detects a change of the contact state, the processor unit may interrupt the query of other contacts or other processes, in order to perform a second query of the contact. The processor unit is configured to perform the second query a few nanoseconds after the first query, for example 47 nanoseconds. The delay between the first and second queries is long enough to exclude the influence of any electrostatic discharge. The delay between the first and second queries also is kept so short that any expected a first bounce cannot happen.

In an advantageous embodiment, the processor unit is configured to perform the second query immediately after the first query. Usually, the processor unit performs various processes. In the context of the invention, immediately means that the processor unit changes the order of the processes to be performed so that the second query is the very next one.

In a further embodiment of the invention, the processor unit is configured to provide the output signal immediately after the second query. Providing the output signal means, for example, that the processor unit deposits a data packet in a buffer, wherein these data packets further are retrieved by a data transmission protocol. The output signal may be given priority, for example. Reporting the change of the contact state or retrieving the data packet may thus be enabled as soon as possible.

In one embodiment of the invention, the processor unit is configured to detect a further change of the contact state only upon the lapse of a predetermined debounce time of the contact. For example, the processor unit thus does not query the contact state of the contact until the debounce time has lapsed. During the debounce time it is also possible for the processor unit to query the contact state, but not to acknowledge or take into account any change of the contact state until the debounce time has lapsed. In this way, it is ensured that bounces inevitably occurring after the first and second queries are not mistaken for an actuation of the switch, and thus would not serve as the trigger of an output signal According to an embodiment of the invention, the apparatus comprises several mechanical switches, wherein the mechanical switches are implemented as keys in a keyboard.

In one embodiment of the invention, apparatus comprises more than one mechanical switch.

In one embodiment, the processor unit is configured to perform a second query of a first switch before performing a first query of a second switch. Upon detection of a change of the contact state of a first switch, the processor unit prioritizes the second query of the first switch, and thus a first query of a second switch is performed only after performing first and second queries of a first switch.

The object is also achieved by a method according to the present invention.

Thus, the object is achieved by a method of detecting a change of a contact state of a contact of a mechanical switch, wherein the contact is opened and/or closed, wherein a first query and a second query of a contact state of the contact are performed, wherein an output signal is provided on the basis of information on a change of the contact state of the contact detected by means of the first and second queries, wherein the second query is performed after the first query with a timing so that the second query precedes an expected bounce of the contact. In other words, if the change of the contact state of the contact is detected in a first query of the contact state of the contact, a second query of the contact state is performed within a certain time period. For example, the certain time period may correspond to a time interval between opening and/or closing the contact and a first bounce of the contact if the change is detected at once.

BRIEF DESCRIPTION OF THE DRAWINGS

Embodiments of the invention are illustrated in the drawings and explained in greater detail in the subsequent description. In the figures.

DETAILED DESCRIPTION

Figure 1:
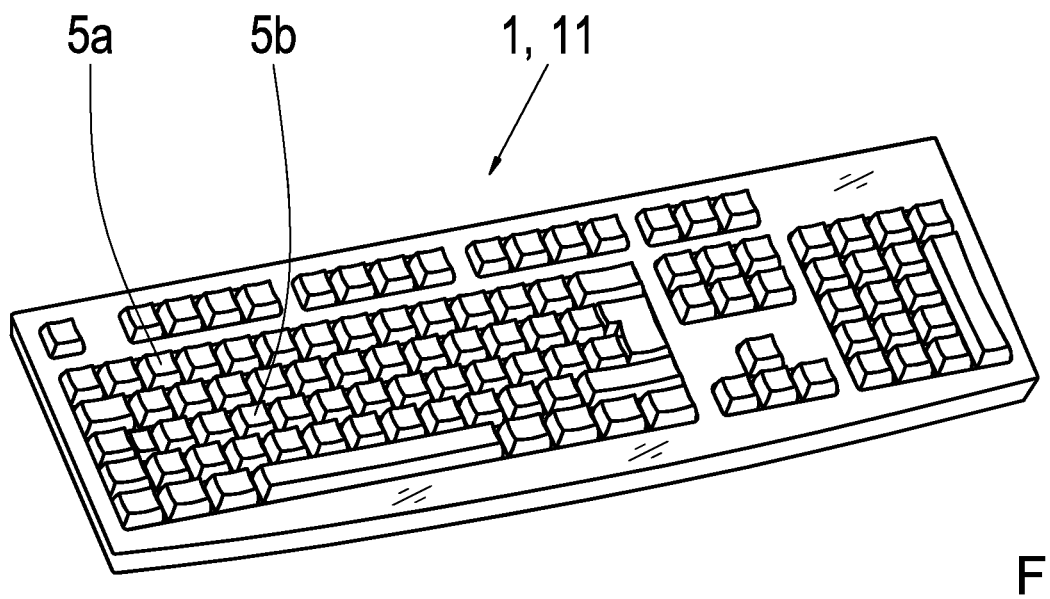
FIG. 1 shows an embodiment of the apparatus in which the mechanical switches are implemented as keys in a keyboard.

FIG. 1 shows an embodiment of the apparatus in which the mechanical switches 5 are implemented as keys 5 in a keyboard 11. In such a keyboard 11, when one of the switches 5 or keys 5 is pressed, an electric contact 7 is either closed or opened. Also, when the key 5 is released in, the contact 7 is opened or closed correspondingly. Opening and closing such mechanical keys 5 always is accompanied by bouncing behavior. This means that when a key 5 is pressed, for example, a contact 7 is closed, but bounces between closed and open states I/O for some time. The time in which the electric contact 7 bounces is called debounce time Tp. During the debounce time Tp, a query A1 of the contact 7 at any moment may indicate that the contact state I/O is either open or closed. Conventionally, the uncertainties entailed by this bouncing behavior are avoided by performing a second query A2 of the contact 7 after the debounce time Tp has lapsed. However, this leads to a delay between the actuation T0 of the keys 5 and the time of reporting the change of the contact state I/O caused by this actuation T0. This delay may be eliminated by performing a second query A2 of the contact 7 immediately after a change has been detected. Thus, the speed of the keyboard 11 may be increased. For example, instead of a 10 millisecond delay between actuation T0 and reporting, a keyboard 11 configured in such a manner may report within 1 millisecond after the actuation of the key 5.

Figure 2:
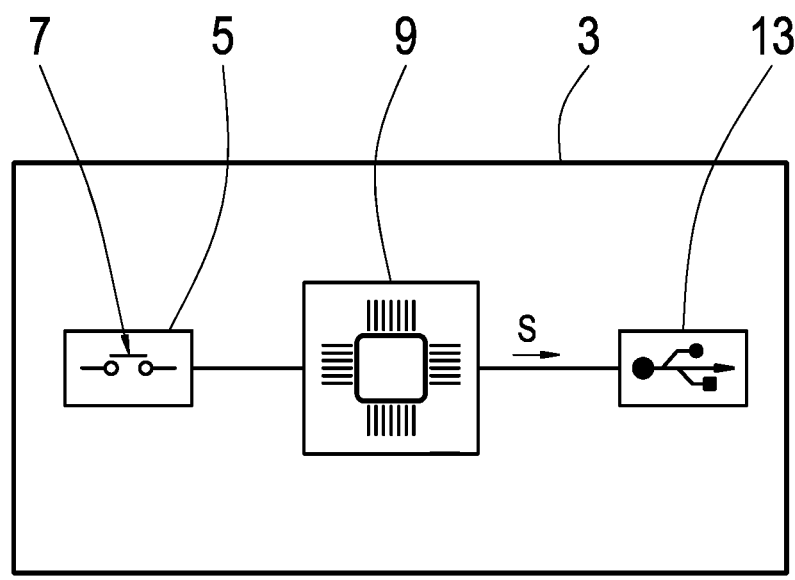
FIG. 2 shows a schematic illustration of an embodiment of the apparatus.

FIG. 2 shows a schematic illustration of an embodiment of the apparatus 1 with a mechanical switch 5, a processor unit 9 and a USB interface 13. The processor unit 9 serves to regularly query or sample the electric contact 7 in the mechanical switch 5. For example, the processor unit 9 checks the contact state I/O of the contact 7 once per millisecond. The results of the query A1 may be filed or stored by the processor unit 9. For example, the processor unit may be a Cortex M0 32 bit processor with 16 bit memory. The result of the query A1 show that a change of the contact state I/O taken place, the order of the pending processes the processor unit 9 is changed so that the second query A2 of the contact state I/O of the contact 7 takes place or is performed next. The second query A2 is performed in the time after the first detection of a state change but before a first bounce P of the contact 7 can take place. So as to ensure that there is enough time left to perform the second query A2, the time period between regular queries A1 of processor units 9 at the contact 7 may be kept shorter than the time between an actuation T0 and a first bounce P. If the change of the contact state I/O is confirmed by the second query A2, the processor unit 9 changes the order of pending processes for a second time, so that this change is reported as quickly as possible. Reporting takes place via an output signal S, which is filed as a data packet S in the USB buffer for output via the USB interface, for example.

In the USB protocol, data is retrieved regularly, and it is valid to retrieve a certain amount of data with each cycle of the USB protocol. Thus, in order to ensure that the data packet S with the information on the change of the contact state I/O is retrieved in the next USB cycle, the output signal S or the data packet S is given priority in the buffer. Hence, it is possible for the apparatus 1 to be able to report a change of the contact state I/O within 1 millisecond after the actuation T0 of the switch 5. This represents a tenfold improvement compared to conventional switches 5 or keyboards 11, which usually take 10 milliseconds or longer to report a change of the contact state I/O.

Figure 3:
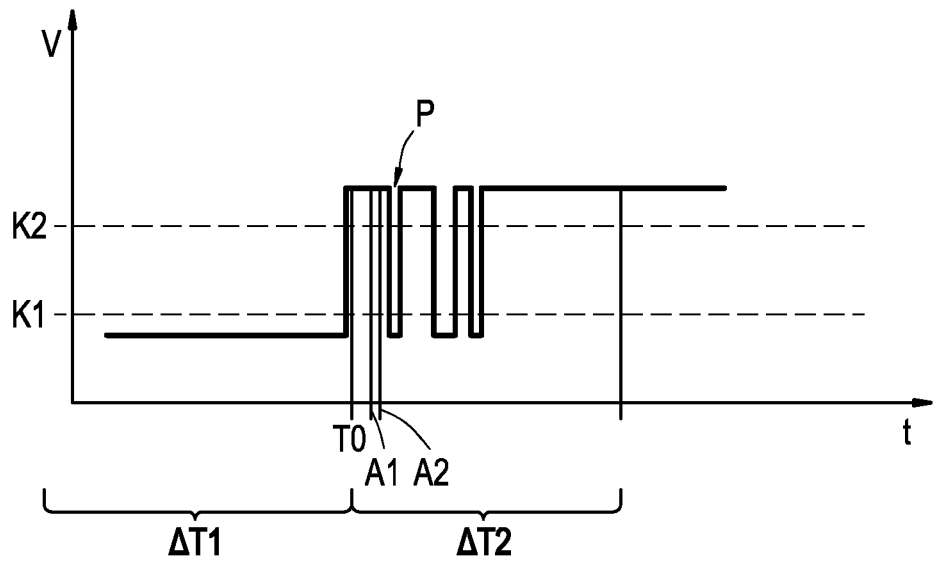
FIG. 3 shows a graphical representation of a switch signal of a mechanical switch.

FIG. 3 shows a graphical representation of a switch signal mechanical switch 5. In particular, there is shown a voltage curve of a switch signal over time. In a first fraction of time $\Delta T1$, the voltage V of the signal is below a first threshold value K1. Suddenly, upon actuation T0 of the switch 5, the voltage V jumps above a second threshold value K2. The contact 7 is queried regularly or the voltage V of the switch signal is sampled regularly by the processor unit 9. At a first time instant A1, the contact 7 is queried for the first time. The processor unit 9 here detects a change of the contact state I/O. Immediately thereafter, the processor unit 9 performs a second query A2 of the contact 7. The second query A2 takes place in a time period before the first bounce P the contact signal can occur. In this way, it is also avoided that electromagnetic interference can produce corruption of a change of the contact state I/O, and it is made the condition that it is waited for the interference suppression time or debounce time Tp before performing a second query A2. However, it is still necessary to exclude the possibility of the bounces P of the contact 7 are acknowledged as a change of the contact state I/O from open to closed or closed to open. This is done by the processor unit 9 waiting for a default time period ΔT2. For example, this time period ΔT2 may be twice the expected debounce time Tp. Thus, either the contact 9 is not sampled or queried in this time period ΔT2, or the results of the regular queries A1 of the contact 7 are discarded in the processor unit 9. So as to record a beginning of the runtime of the time period ΔT2, the processor unit may deposit a timestamp with the first or second query in a memory.

Figure 4:
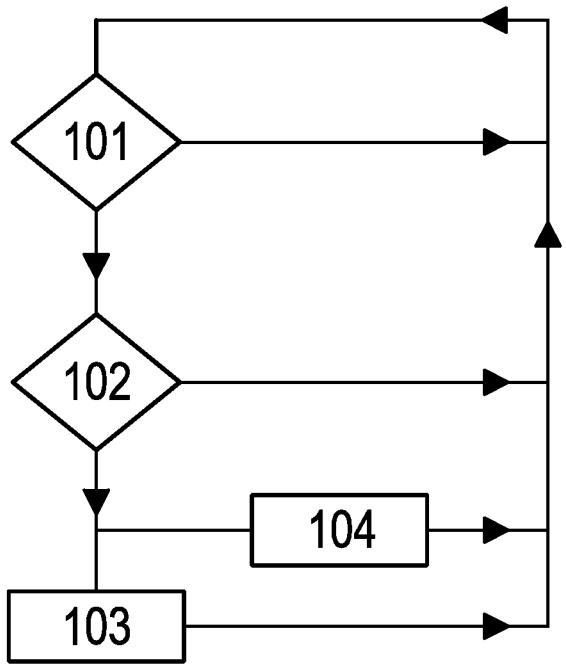
FIG. 4 shows a flowchart of a method according to an embodiment of the invention.

FIG. 4 shows a flowchart of a method according to an embodiment of the invention. In a first step 101, a query A1 of the contact 7 is performed. If a change of the contact state I/O is detected, a second query A2 of the contact 7 is performed in a second step 102. If no changes are detected, the method starts again at the first step 101. If no changes with respect to the original contact state I/O are detected in the second step 102, the method also again starts from the beginning at the first step 101. The change of the contact state I/O detected in the first step 101 is confirmed in the second step 102, two processes are triggered at the same time. In a first process in a third step 103, the change of the contact state I/O is reported or provided. In a second process, which is triggered in a fourth step 104, a timestamp marking the beginning of a time period ΔT2 in which no further change of the contact state I/O is acknowledged is set.

What is claimed:

1. An apparatus with circuitry comprising:
   at least one mechanical switch serving to open and/or close an electric contact and
   a processor unit serving to perform a first query and a second query of a contact state of the contact, the processor unit further serving to provide an output signal on the basis of information on a change of the contact state of the contact detected by way of the first and second queries,
   wherein the processor unit is configured to perform the second query after the first query with a timing so that the second query precedes a first bounce of the contact,
   wherein the processor unit is configured to perform the second query immediately after the first query,
   wherein the processor unit is configured to provide the output signal immediately after the second query,
   wherein the processor unit is configured to detect another change of the contact state only when a default debounce time of the contact has lapsed, and
   wherein the apparatus comprises several mechanical switches, wherein the mechanical switches are implemented as keys in a keyboard.

2. The apparatus according to claim 1, wherein that if the apparatus comprises more than one mechanical switch, the processor unit is configured to perform a second query of a first switch before performing a first query of a second switch.

3. The apparatus according to claim 1, wherein the processor unit interrupts a query of other contacts in order to perform the second query.

4. The apparatus according to claim 1, wherein the second query is performed about 47 nanoseconds after the first query.

5. A method of detecting change of a contact state of a contact a mechanical switch, comprising:
   opening and/or closing the contact,
   performing a first query and a second query of the contact state of the contact,
   providing an output signal on the basis of information on a change of the contact state of the contact detected by way of the first and second queries,
   performing the second query after the first query with a timing so that the second query precedes a first bounce of the contact,
   wherein the second query is performed immediately after the first query,
   wherein the output signal is provided immediately after the second query,
   wherein another change of the contact state is detected only when a default debounce time of the contact has lapsed, and
   wherein the mechanical switch is implemented as a key in a keyboard.

* * * * *